United States Patent [19]
Minami et al.

[11] Patent Number: 5,488,967
[45] Date of Patent: Feb. 6, 1996

[54] METHOD AND APPARATUS FOR FEEDING GAS INTO A CHAMBER

[75] Inventors: Yukio Minami; Nobukazu Ikeda, both of Osaka, Japan

[73] Assignee: Masako Kiyohara, Kumamoto, Japan

[21] Appl. No.: 327,419

[22] Filed: Oct. 21, 1994

[30] Foreign Application Priority Data

Oct. 27, 1993 [JP] Japan .................................. 5-268689

[51] Int. Cl.⁶ .................................................. F16K 11/12
[52] U.S. Cl. .................. 137/1; 137/14; 137/566; 137/597; 137/601
[58] Field of Search ................... 137/1, 14, 597, 137/601, 599, 566

[56] References Cited

U.S. PATENT DOCUMENTS

| | | | |
|---|---|---|---|
| 4,019,524 | 4/1977 | Whitson et al. | 137/14 |
| 4,037,622 | 7/1977 | Osheroff et al. | 137/597 |
| 4,739,787 | 4/1988 | Stoltenberg | 137/14 |
| 5,259,233 | 11/1993 | Brandt | 137/597 X |
| 5,277,215 | 1/1994 | Yanagawa et al. | 137/14 |
| 5,368,062 | 11/1994 | Okumura et al. | 137/597 X |

*Primary Examiner*—Stephen M. Hepperle
*Attorney, Agent, or Firm*—Griffin, Butler, Whisenhunt & Kurtossy

[57] ABSTRACT

A vacuum deposition chamber alternately receives a reactive gas and an inert gas during a process in which a thin film is formed on a wafer in the chamber. The inert gas flows through a first pressure regulator, a first feed line and a first changeover valve into the chamber. The reactive gas flows through a second pressure regulator, a second feed line and a second changeover valve into the chamber. A vent line is connected to a vacuum pump and a pressure regulating valve which vents to the atmosphere to thereby control the vacuum pressure in the vent line. A first shunt valve is connected between the vent line and the first feed line and a second shunt valve is connected between the vent line and the second feed line. When the first changeover valve is opened to permit flow of reactive gas into the chamber, the second shunt valve is opened to evacuate the second feed line and when the second changeover valve is opened to permit flow of inert gas into the chamber, the first shunt valve is opened to evacuate the first feed line. By alternately evacuating the feed lines, pressure fluctuations which usually occur in the chamber at the time of changeover from one gas to the other, are suppressed.

11 Claims, 8 Drawing Sheets

METHOD AND APPARATUS FOR FEEDING GAS INTO A CHAMBER

FIELD OF THE INVENTION

The present invention relates to a method and apparatus for feeding gases into a chamber such as a vacuum deposition chamber in which semiconductor films are formed. More particularly, the invention provides a method and apparatus for alternately admitting a reactive gas and an inert gas to the chamber in a manner which causes minimum fluctuation of the pressure within the chamber at the time of changeover from one gas to the other.

BACKGROUND OF THE INVENTION

A conventional apparatus for manufacturing semiconductor wafers includes a chamber in which environmental conditions are closely controlled to fixed values suited to the film forming process. During the course of forming thin film wafers, a reactive gas and an inert gas are introduced alternately into the chamber. As the gases are alternately introduced into the chamber, pressure fluctuations occur. The pressure fluctuations cause variations in film thickness and may cause plasma to fail to occur in the chamber. More recent trends toward high integration of semiconductors has led to even thinner films and the pressure variations occurring during the changeover from one gas to the other has made it difficult to control the film thickness to the desired degree.

Figure 4:
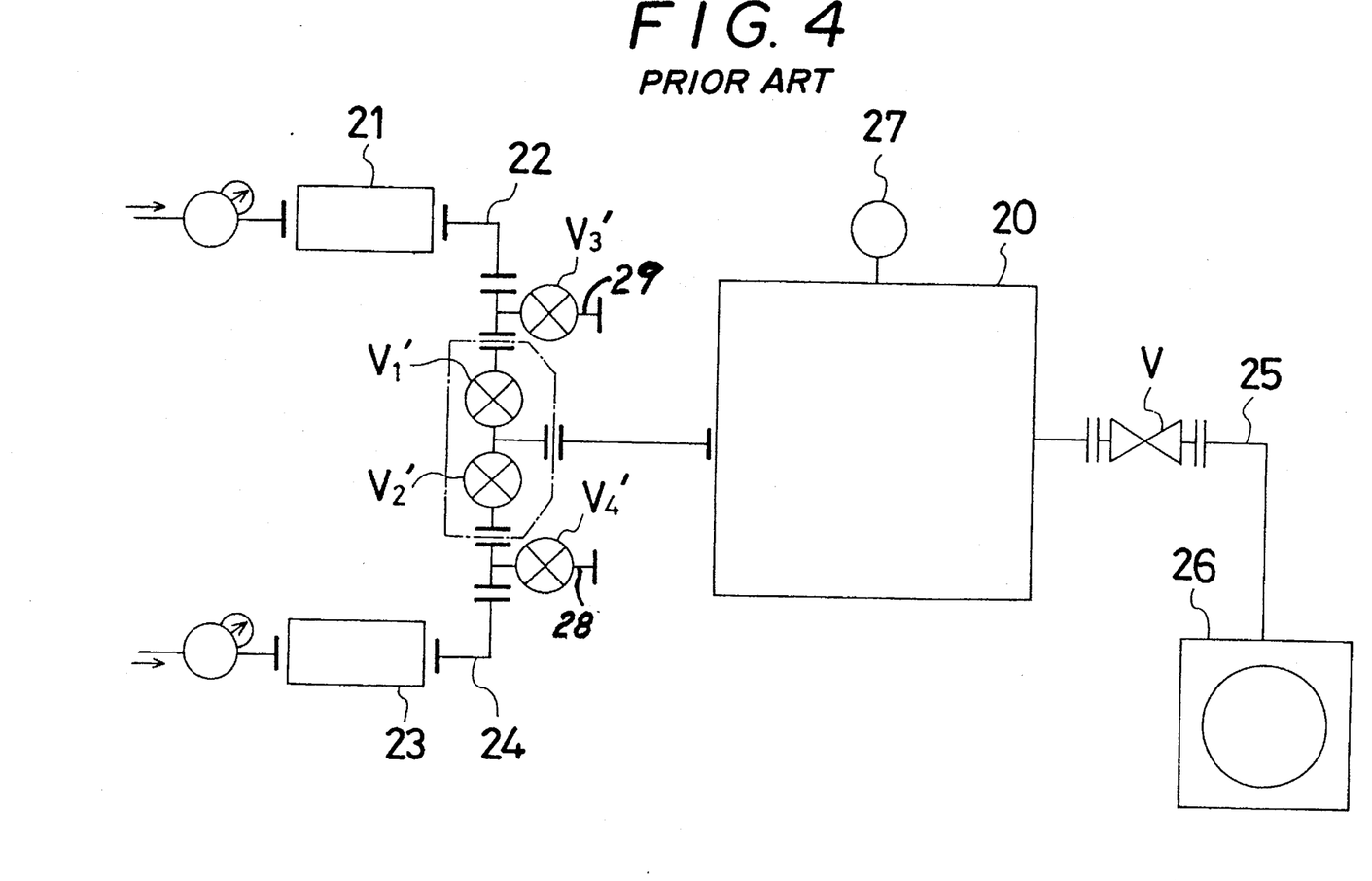
FIG. 4 illustrates apparatus according to the prior art for alternately feeding first and second gases into a chamber.

FIG. 4 illustrates a chamber 20 and prior art apparatus for controlling the feeding of gases into a chamber. The apparatus includes first and second pressure regulators 23, 24, first and second line changeover valves $V_1'$ and $V_2'$, first and second shunt valves $V_3'$, $V_4'$ located in vent pipes 28, 29 that are connected to the primary or gas input sides of changeover valves $V_1'$, $V_2'$. A vacuum gauge 27 is provided to measure the pressure in chamber 20, and a vacuum pump 26 is connected via a vacuum exhaust line 25 and a switch valve V to the chamber 20 to evacuate the Chamber to a set pressure.

Reactive and inert gases are supplied from sources (not shown) to the valves $V_1'$, $V_2'$ through pressure regulators 21, 23 and feed lines 22, 24. The valves $V_1'$, $V_2'$ are operated alternately and simultaneously so that the reactive gas and the inert gas are alternately introduced into chamber 20. The valve $V_1'$ or $V_2'$ that is not open during a specific interval blocks the feed line 22 or 24, respectively. The flow rate of the gases is controlled by the pressure regulators 21, 23, which are mass flow controllers, so that the pressure in chamber 20 may be kept at a set pressure.

Various tests were conducted on the gas feed apparatus of FIG. 4. In these tests, direct touch type metal diaphragm valves were used as the valves $V_1'$, $V_2'$, $V_3'$, $V_4'$. The valves were pneumatically operated by controlling the supply of drive air through a solenoid valve (not shown).

Prior to each test, with valves $V_1'$ and $V_2'$ closed, chamber 20 (measuring 210×210×210 mm) was evacuated by vacuum pump 26. Next, valve $V_1'$ was opened and reactive gas ($N_2$ at a primary pressure of 1.0 kgf/cm$^2$G was supplied to the chamber and pressure regulator 21 adjusted so that the set pressure was established in the chamber. After the pressure in the chamber had stabilized, valve $V_1'$ was closed, valve $V_2'$ opened, to admit inert gas, and the flow rate of pressure regulator 23 adjusted so that the set pressure was established in chamber 20. The vacuum pressure in the chamber was set at the same value (±0.5%) for the inert gas flow as for the reactive gas flow.

After the preliminary steps set forth above were completed, various tests were carried out using different set pressures in chamber 20, different intervals between changeover of valves $V_1'$ and $V_2'$ and different conditions of the shunt valves $V_3'$ and $V_4'$ as set forth in Table I.

TABLE I

| Test No. | Chamber Pressure (Torr) | Vent Line | Changeover Interval (sec) | Results Shown |
| --- | --- | --- | --- | --- |
| 1 | 5.0 | changeover | 30,10,5 | 5A |
| 2 | 5.0 | closed | 30,10,5 | 5B |
| 3 | 0.2 | changeover | 30,10,5 | 6A |
| 4 | 0.2 | closed | 30,10,5 | 6B |
| 5 | 760, 500, 100, 50, 10, 5, 1, 0.2 | changeover | 60,30,10,5 | 7A |
| 6 | 760, 500, 100, 50, 10, 5, 1, 0.2 | closed | 60,30,10,5 | 7B |

TABLE I

In all tests, the changeover valves $V_1'$ and $V_2'$ were alternately opened for the changeover interval. The shunt valves to the vent line were kept continuously closed in some tests. In other tests, the shunt valves were changed over, that is, shunt valve $V_4'$ was opened and closed concurrently with changeover valve $V_1'$ and shunt valve $V_3'$ was opened and closed concurrently with changeover valve $V_2'$. In tests 1–6, mass flow controllers were used as the pressure regulators 21 and 23.

Figure 5A:
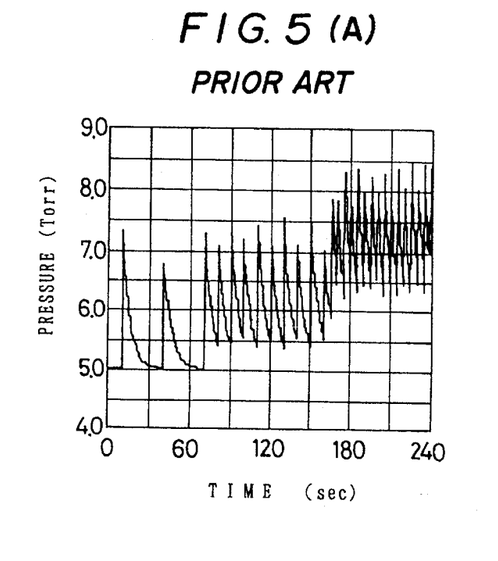
FIGS. 5(A) and 5(B) graphically illustrate variations in pressure in the chamber of FIG. 4 when the vent line is evacuated (FIG. 5(A)) and the vent line is closed (FIG. 5(B)), the set pressure of the chamber being 5.0 Torr.
Figure 5B:
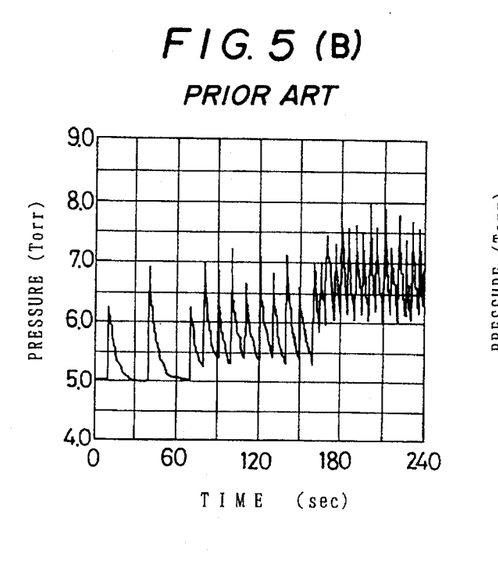
Figure 6A:
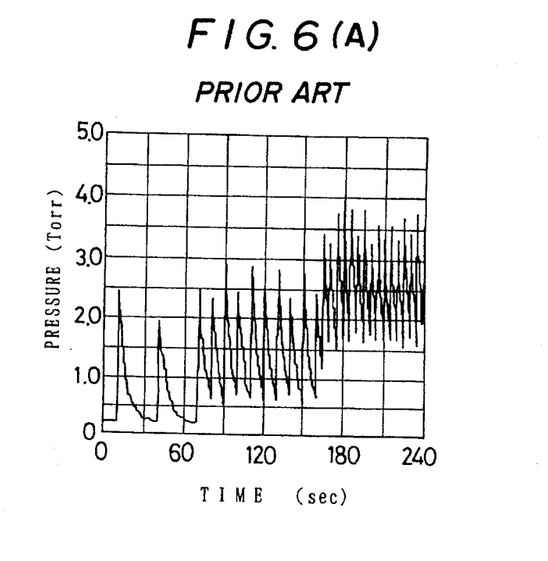
FIGS. 6(A) and 6(B) are graphs similar to those of FIGS. 5(A) and 5(B) where the set pressure of the chamber is 0.2 Torr.
Figure 6B:
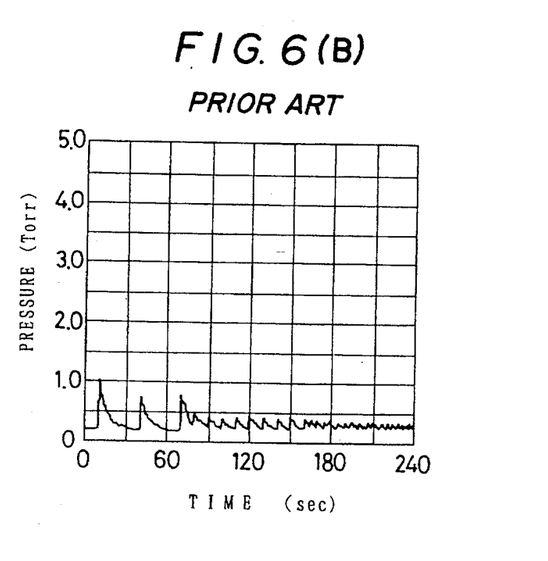
Figure 7A:
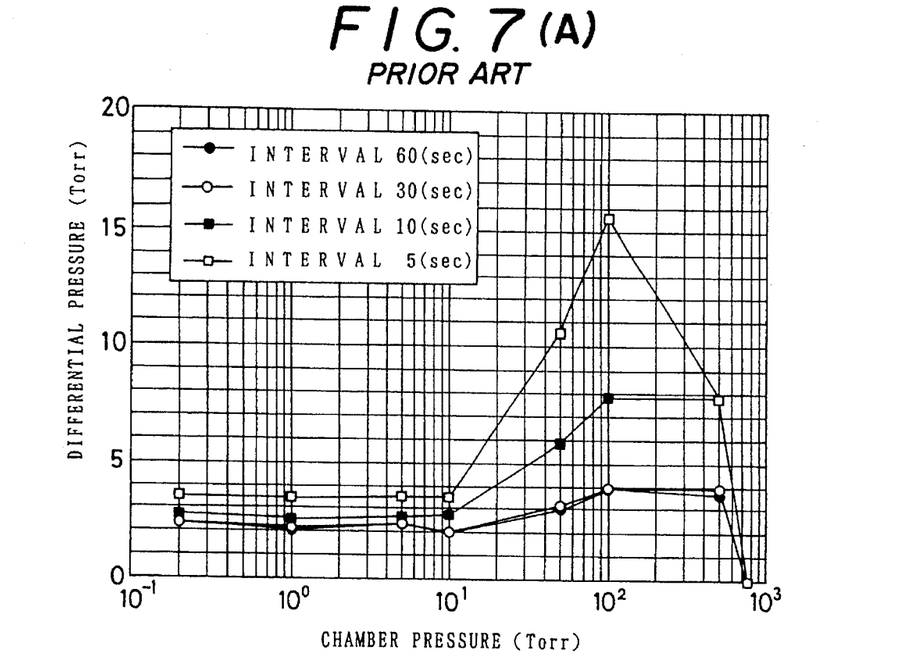
Figure 7B:
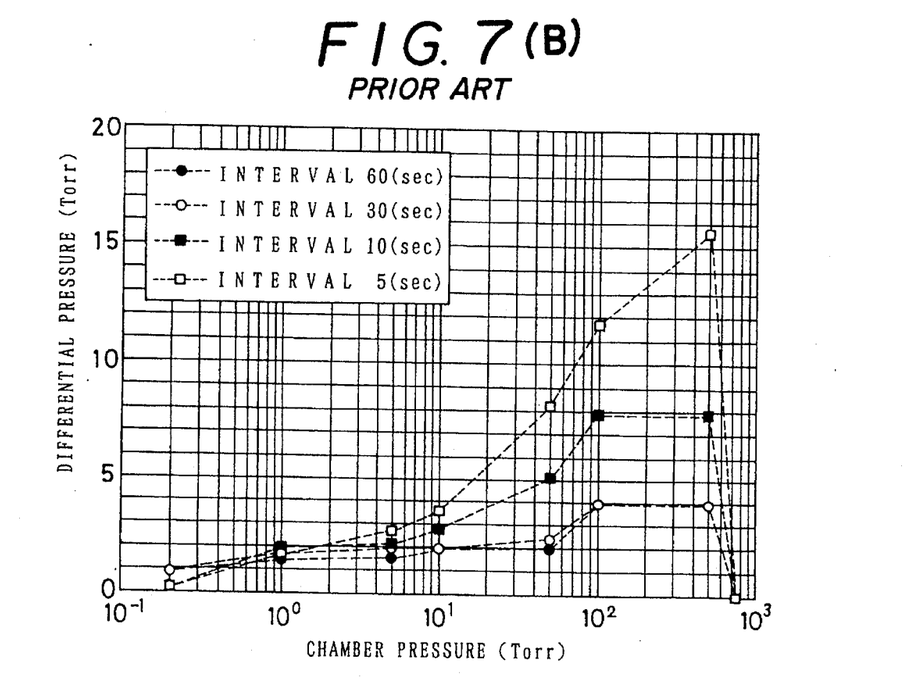

The results of tests 1–6 are graphically illustrated in FIGS. 5(A)–7(B). In FIGS. 5(A)–6(B), the pressure in chamber 20 is shown as a function of time. FIGS. 7(A) and 7(B) show the differential pressure, that is, the magnitude of the pressure fluctuations relative to the set pressure in chamber 20.

FIGS. 8(A) and 8(B) illustrate the effect on pressure fluctuations resulting from use of a specific type of valve as the chamber pressure regulators 21, 23. FIG. 8(A) illustrates the results of a test run under the same conditions as test no. 1 using mass flow controllers as the pressure regulators. FIG. 8(B) shows the results of a test run under the same conditions except that direct touch type diaphragm valves were used as the pressure regulators.

Figure 8:
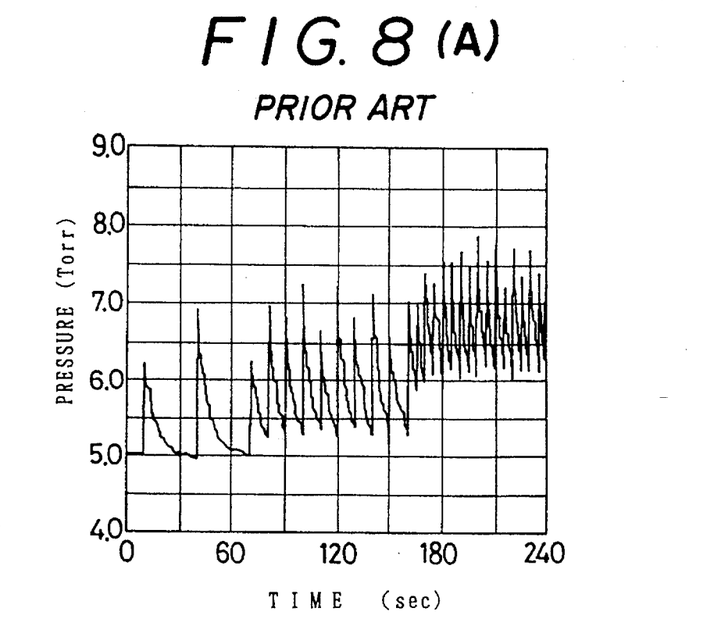
FIGS. 8(A) and 8(B) illustrate pressure fluctuations in the chamber when the apparatus of FIG. 4 is operated under similar conditions, with mass flow controllers being used as the pressure regulators (FIG. 8(A)) and with direct touch diaphragm valves being used as the pressure regulators (FIG. 8(B)).

From the test results illustrated in FIGS. 5(A)–8(B), it may be observed that in the conventional piping system (1) when the pressure in chamber 20 is a vacuum, pressure fluctuations occur when changing over the valves $V_1'$, $V_2'$ as shown in FIGS. 5(A)–6(B), (2) there is a difference between the set pressure in chamber 20 and the pressure occurring in the chamber when changing over from the reactive to inert gas or from the inert to the reactive gas as shown in FIGS. 5(A)–6(B), (3) the pressure difference becomes larger as the interval of changeover becomes shorter as shown in FIGS. 5(A), 5(B) and 6(A), (4) for a given set pressure in chamber 20, the pressure difference tends to be smaller when the gas feed lines 22, 24 are not vented to the atmosphere as is evident by comparing FIGS. 7(A) and 7(B), (5) the pressure difference is smaller when the vacuum pressure is lower but the pressure difference becomes much greater as the chamber pressure increases, and (6) the pressure difference is much larger when mass flow controllers are used as chamber pressure regulators (FIG. 8(A)) as compared to the use of direct touch diaphragm type flow regulating valves (FIG. 8(B)).

In the conventional apparatus for introducing gases into the chamber, it was practically impossible to suppress pressure fluctuations in the chamber when changing over from one gas feed line to the other.

SUMMARY OF THE INVENTION

An object of the present invention is to provide a method and apparatus for feeding gases to a chamber without causing fluctuations in the pressure within the chamber.

Another object of the invention is to provide a method for alternately feeding a first gas successively through a first pressure regulator, a first feed line and a first changeover valve to a chamber evacuated to a set pressure, or feeding a second gas successively through a second pressure regulator, a second feed line and a second changeover valve to the chamber, the method comprising alternately evacuating the second feed line while opening the first changeover valve to feed the first gas to the chamber, and evacuating the first feed line while opening the second changeover valve to feed the second gas to the chamber, whereby the pressure in the first feed line at the time the first changeover valve is opened and the pressure in the second feed line at the time the second changeover valve is opened is approximately equal to the set pressure in the chamber.

A further object of the invention is to provide a method as described above wherein the chamber is evacuated to a set pressure of between about 0.2 to 5.0 Torr and the first and second feed lines are alternately evacuated by alternately connecting them to a vent line maintained at a pressure of about 50 Torr or less.

Still another object of the invention is to provide an improvement in an apparatus for alternately feeding a first gas successively through a first pressure regulator, a first feed line and a first changeover valve to a chamber evacuated to a set pressure, or feeding a second gas successively through a second pressure regulator, a second feed line and a second changeover valve to the chamber, the improvement comprising means for alternately evacuating the second feed line when the first changeover valve is open to feed the first gas to the chamber, and evacuating the first feed line when the second changeover valve is open to feed the second gas to the chamber whereby the pressure in the first feed line at the time the first changeover valve is opened and the pressure in the second feed line at the time the second changeover valve is opened is approximately equal to the set pressure in the chamber.

A further object of the invention is to provide an improvement described above wherein the means for alternately evacuating the first and second feed lines comprises a vent line, a vacuum pump connected to the vent line, a first shunt valve connected between the vent line and the first feed line and a second shunt valve connected between the vent line and the second feed line.

Yet another object of the invention is to provide an improvement as described above and further comprising a pressure regulating valve for regulating the pressure in the vent line, the pressure regulating valve venting the vent line to atmosphere to regulate the pressure in the vent line.

In a preferred embodiment, the chamber is a chamber in which a film is formed on a wafer, the first and second gases are a reactive gas and an inert gas, respectively, and means are provided for evacuating the chamber to the set pressure.

The first and second pressure regulators, the first and second changeover valves and the first and second shunt valves preferably comprise direct touch metal diaphragm valves although mass flow controllers may be used as the pressure regulators.

Other objects and advantages of the invention and the manner of making and using it will become obvious upon consideration of the following description and accompanying drawings.

BRIEF DESCRIPTION OF THE DRAWINGS

FIG. 7 (A) and 7 (B) graphically illustrate the pressure differential in the chamber when the apparatus of FIG. 4 is operated under various set chamber pressures and changeover intervals, the vent line being open (FIG. 7(A)) or closed (FIG. 7(B));

DESCRIPTION OF THE INVENTION

Figure 1:
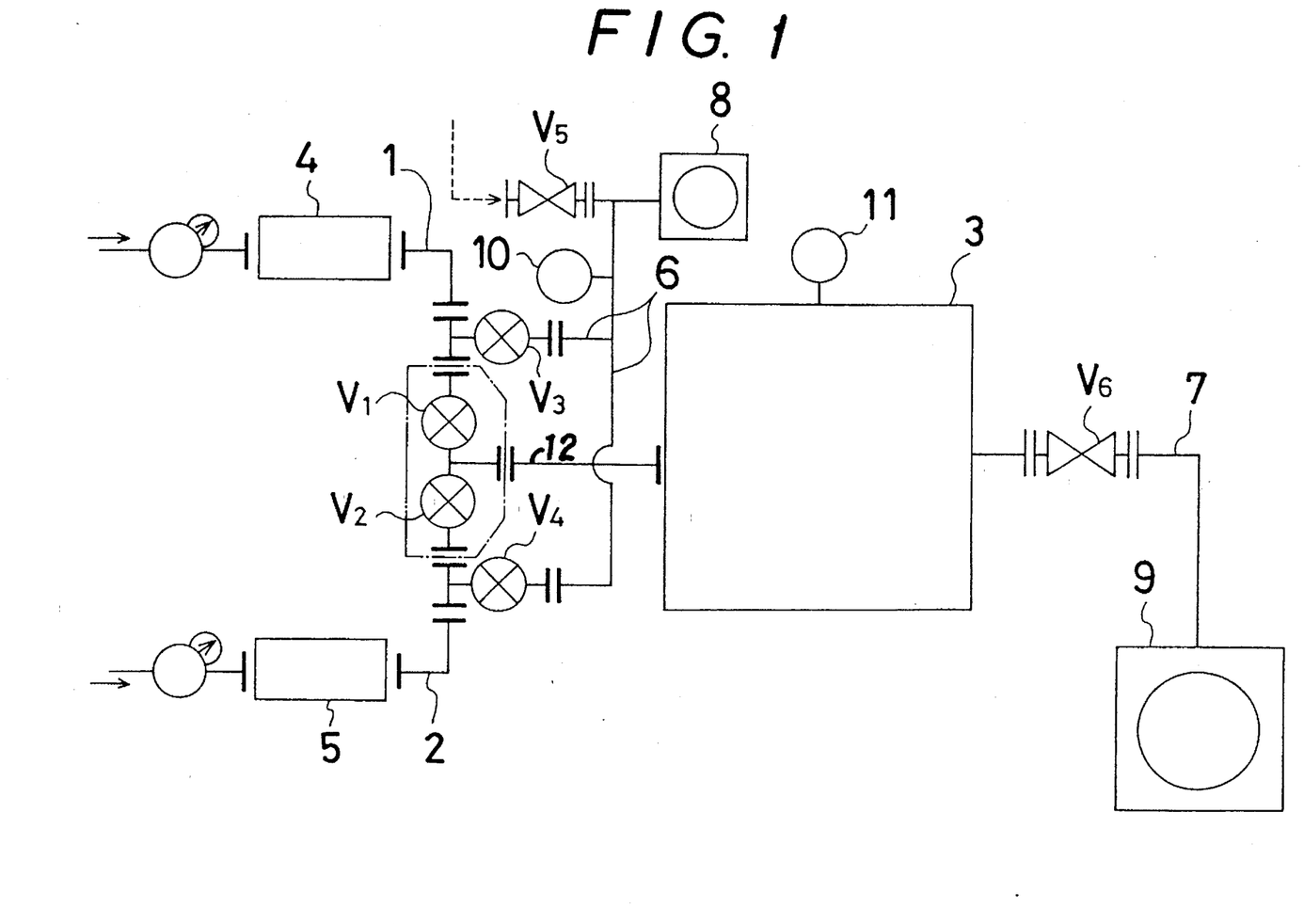
FIG. 1 illustrates apparatus according to the present invention for alternately feeding first and second gases into a chamber.

FIG. 1 illustrates a gas piping system with which the method of the present invention may be practiced in a semiconductor manufacturing plant. The piping system includes a chamber 3 in which thin film wafers are formed according to a known process. A vacuum pump 9 is connected by a pipe 7 and a valve 6 to chamber 3 so that the pump may evacuate the chamber to a set pressure.

Figure 9:
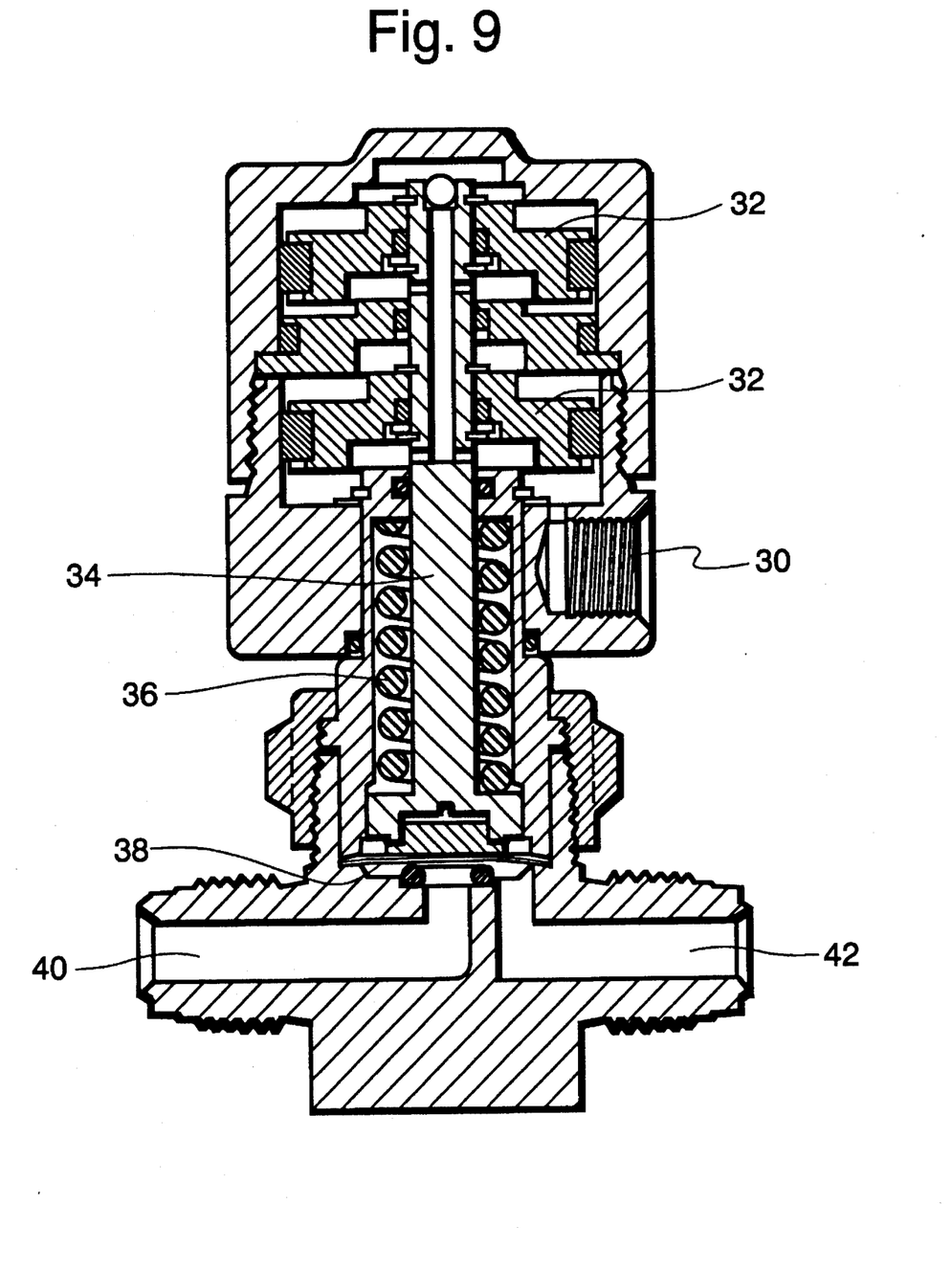
FIG. 9 is a sectional view of a conventional direct touch metal diaphragm valve suitable for use in the invention.

A reactive gas is supplied from a source (not shown) to a first chamber pressure regulator 4 having an output feed line 1 connected to a change-over valve $V_1$. An inert gas is supplied from a source (not shown) to a second chamber pressure regulator 5 having an output feed line 2 connected to a change-over valve $V_2$. The output sides of valves $V_1$ and $V_2$ are connected to chamber 3 by a common feed pipe 12. A first shunt valve $V_3$ is connected between feed line 1 and a vent line 6. A second shunt valve $V_4$ is connected between feed line 2 and vent line 6. A vacuum pump 8 evacuates vent line 6 and a pressure regulating valve $V_5$, vented to atmosphere, regulates the pressure in vent line 6. Vacuum gauges 10 and 11 are provided for indicating the pressure in vent line 6 and chamber 3, respectively. The valves $V_1$–$V_5$ are all pneumatically driven and are opened and closed by supplying driving air from a source controlled by a solenoid valve (not shown). FIG. 9 is a sectional view of a direct touch type metal diaphragm valve which may be used as the valves $V_1$–$V_5$. The valve is disclosed in U.S. Pat. No. 5,186,434. Briefly, as pressure is applied to inlet 30, it moves piston 32 and stem 34 upwardly against spring 36. As the stem moves upwardly, metal diaphragm 38 opens inlet passage 40 so that fluid may flow from inlet passage 40 to outlet passage 42. When the pressure at inlet 30 is removed, spring 36 moves stem 34 and diaphragm 38 down to thereby close the inlet passage 40.

The gas feed system of FIG. 1 is operated as follows. Pump 9 evacuates chamber 3 to a pressure suitable for the film forming process. When reactive gas is to be supplied to chamber 3, changeover valve $V_1$ and shunt valve $V_4$ are opened as changeover valve $V_2$ and shunt valve $V_3$ are closed. The reactive gas flows successively through pressure regulator 4, reactive gas feed line 1, changeover valve $V_1$ and line 12 to chamber 3. The flow rate of the reactive gas is controlled by pressure regulator 4 so that the pressure in chamber 3 is suitable for the film forming process.

While reactive gas is flowing into chamber 3, vacuum pump 8 evacuates vent line 6 and valve $V_5$ is controlled to adjust the pressure in vent line 6 so that the pressure in feed line 2 is approximately equal to the pressure in chamber 3. Since shunt valve $V_4$ is open, inert gas in feed line 2 flows into vent line 6 so that the pressure in feed line 2 is approximately equal to the pressure in chamber 3.

When inert gas is to be supplied to chamber 3, changeover valve $V_2$ and shunt valve $V_3$ are opened as changeover valve $V_1$ and shunt valve $V_4$ are closed. The inert gas flows successively through pressure regulator 5, inert gas feed line 2, changeover valve $V_2$ and line 12 to chamber 3. The flow rate of the inert gas is controlled by pressure regulator 5 so that the pressure in chamber 3 is suitable for the film forming process.

While inert gas is flowing into chamber 3, vacuum pump 8 evacuates vent line 6 and valve $V_5$ is controlled to adjust the pressure in vent line 6 so that the pressure in feed line 1 is approximately equal to the pressure in chamber 3. Since shunt valve $V_3$ is open, reactive gas in feed line 2 flows into vent line 6 so that the pressure in feed line 2 is approximately equal to the pressure in chamber 3.

From the foregoing description it should be obvious that at the time valve $V_1$ is opened to admit reactive gas into chamber 3 from feed line 1, the pressure of the reactive gas in feed line 1 is approximately equal to the pressure in the chamber. Also, at the time valve $V_2$ is opened to admit inert gas into chamber 3 from feed line 2, the pressure of the reactive gas in feed line 2 is approximately equal to the pressure in the chamber. Thus, pressure fluctuations in chamber 3 at the time of changeover from one gas to the other are suppressed.

FIGS. 2(A)–2(D) and 3 graphically illustrate the results of tests conducted on the gas piping system of FIG. 1. Prior to each test, the following preparatory steps were taken. With valves $V_1$ and $V_2$ closed, chamber 3, measuring 210 mm×210 mm×210 mm was evacuated and exhausted by vacuum pump 9. Valves $V_1$ and $V_4$ were opened and valves $V_2$ and $V_3$ closed. $N_2$ gas at a primary pressure of 1.0 kgf/cm²G was supplied to chamber 3 through the reactive gas feed line 1 and the flow rate was adjusted by adjusting flow regulator 4 so that the set pressure was established in the chamber. $N_2$ gas at the same pressure was applied to the inert gas feed line 2 and the vent line pressure regulating valve $V_5$ adjusted so that the pressure in vent line 6 would release when it exceeded atmospheric pressure. When the pressure in chamber 3 was stabilized, valves $V_1$ and $V_4$ were closed and valves $V_2$ and $V_3$ opened. Flow regulator 5 was then adjusted. The pressure in vent line 6 was observed on vacuum gauge 8 to confirm that the pressure in the vent line 6 when shunt valve $V_3$ was open was the same as the pressure in the vent line when valve shunt $V_4$ was open. The valves were switched again so that reactive gas from feed line 1 flowed into the chamber. After the pressure in the chamber stabilized, as observed on gauge 11, the system was operated as it would be in actual use. That is, valves $V_2$ and $V_3$ were opened while valves $V_1$ and $V_4$ were closed, and after specified intervals, valves $V_2$ and $V_3$ were closed while valves $V_1$ and $V_4$ were opened. Vacuum pump 8 was on to evacuate vent line 6.

Figure 2A:
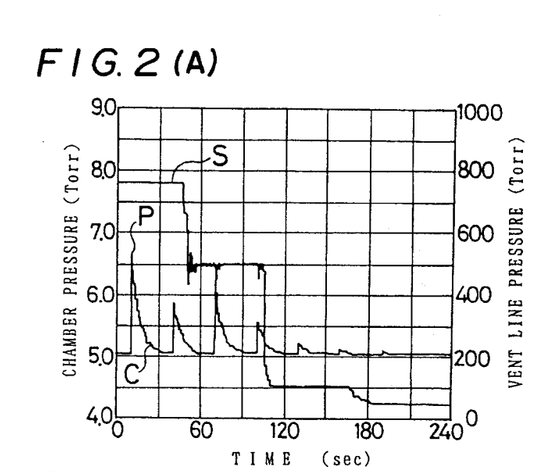
FIGS. 2(A)–2(D) graphically illustrate variations in pressure in the chamber when operating the apparatus of FIG. 1 under various test conditions.

FIG. 2(A) graphically illustrates the results of first tests wherein the pressure in chamber 3 was initially set to approximately 5.0 Torr, the interval between valve changeovers was 30 seconds, and valve $V_5$ was adjusted to provide successive pressures in vent line 6 of 760, 500, 100 and 50 Torr (curve S).

Figure 2B:
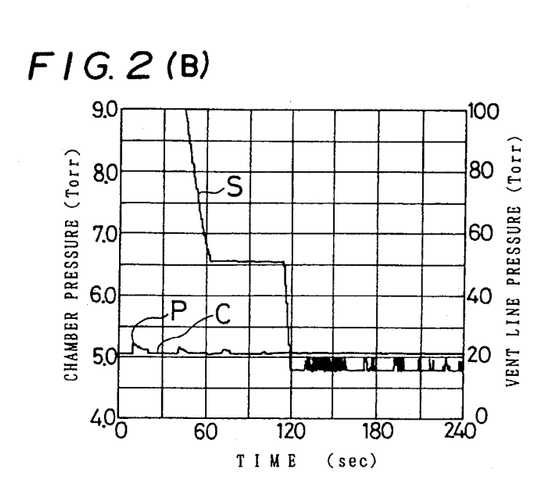

FIG. 2(B) shows the results of a test wherein the pressure in chamber 3 was initially set to approximately 50 Torr, the interval between valve changeovers was successively changed from 30 to 10 to 5 sec, and the valve $V_5$ was successively set for 100 Torr, 50 Torr or completely closed.

Figure 2C:
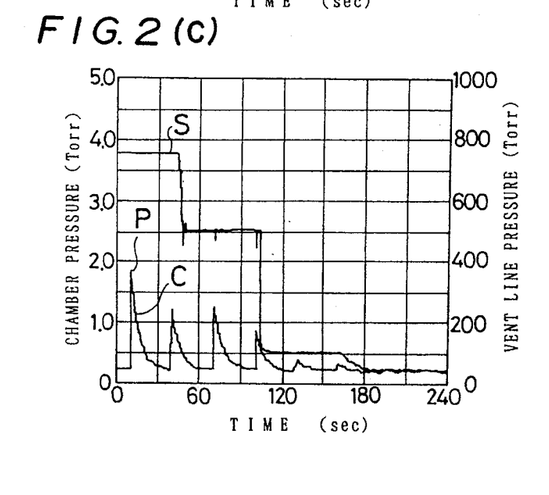

In a third test, the valve changeover interval was 30 sec and the valve $V_5$ was adjusted to provide successive pressures in vent line 6 of 760, 500, 100 and 50 Torr, as in the first test, but the pressure in chamber 3 was initially set to 0.2 Torr. FIG. 2(C) graphically illustrates the results.

Figure 2D:
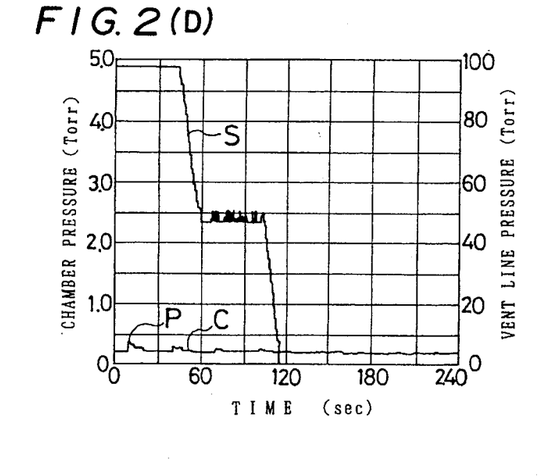

In a fourth test the pressure in chamber 3 was set at 0.2 Torr and the line changeover interval was successively changed from 30 to 10 to 5 sec. Valve $V_5$ was successively changed to provide in vent line 6 a pressure of 100 or 50 Torr or the maximum vacuum available from vacuum pump 8 with the valve closed. FIG. 2(D) illustrates the results.

Figure 3:
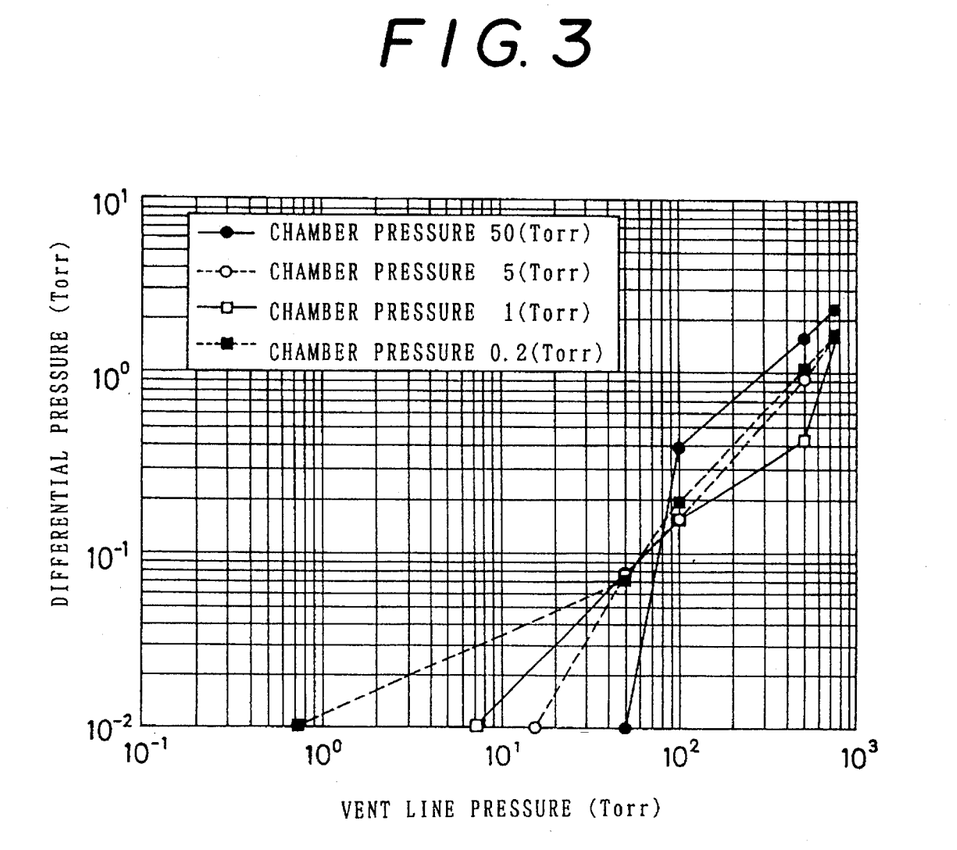
FIG. 3 graphically illustrates the variations from set pressure of the pressure in the chamber as a function of vent line pressure and valve changeover interval.

FIG. 3 graphically illustrates the results of a further series of tests. Four tests were run in which the chamber pressure was set to 0.2, 1.0, 5 and 50 Torr. Valve $V_5$ was set to vent the vent line 6 at pressures greater than 50 Torr, the valve being closed at pressures of 50 Torr or less. The plotting point of the pressure difference in FIG. 3 is the maximum value of the pressure difference observed when a changeover was made from feed line 1 to feed line 2, or from feed line 2 to feed line 1.

From FIG. 3 it is evident that for a given set chamber pressure, the differential pressure becomes smaller as the vent line pressure approaches the chamber pressure. Also, from FIGS. 2(A)–2(D) and 3 it may be observed that as the pressure (curve S) in vent line 6 is regulated from atmospheric pressure toward vacuum, the peak fluctuation (P) in the chamber pressure (curve C) become progressively smaller for a given set pressure in the chamber. From FIGS. 2(A) and 2(C) it is seen that as the pressure in chamber 3 is decreased the vacuum in vent line 6 must be greater, that is, the vent line pressure must be lower, in order to suppress significant pressure fluctuations in the chamber. FIGS. 2(B) and 2(D) show that if the relationship between the chamber pressure and the vent line 6 is such as to suppress fluctuations, the switchover interval may be quite short and still not cause significant fluctuations in the chamber pressure.

From the foregoing description it is seen that the present invention provides a novel method and apparatus for alternately feeding first and second gases to a vacuum chamber without causing fluctuations in the pressure within the chamber at the time of changeover from one gas to the other. This is accomplished by evacuating the gas feed line which is blocked at any given time so that when that gas feed line is unblocked to allow gas flow into the chamber, the pressure in the gas feed line is nearly the same as that in the chamber.

A preferred embodiment of the invention has been described in detail by way of illustration. It will be understood that various modifications and substitutions may be made in the described embodiment without departing from the spirit and scope of the invention as defined by the appended claims. For example other means may be adopted to cause the pressure in a blocked feed line to approximate the set chamber pressure at the time the feed line is opened. The internal diameter of the feed line may be chosen to accomplish this.

We claim:

1. A method for alternately feeding a first gas successively through a first pressure regulator, a first feed line and a first changeover valve to a chamber evacuated to a set pressure, or feeding a second gas successively through a second pressure regulator, a second feed line a second changeover valve to said chamber, said method comprising alternately evacuating the second feed line while opening the first changeover valve to feed the first gas to the chamber, and evacuating the first feed line while opening the second changeover valve to feed the second gas to the chamber, whereby the pressure in said first feed line at the time said first changeover valve is opened and the pressure in said second feed line at the time said second changeover valve is opened is approximately equal to the set pressure in the chamber.

2. A method as claimed in claim 1 wherein said chamber is evacuated to a set pressure of between about 0.2 to 5.0 Torr.

3. A method as claimed in claim 1 wherein said first and said second feed lines are alternately evacuated by alternately connecting them to a vent line maintained at a pressure of less than about 100 Torr.

4. A method as claimed in claim 3 wherein said chamber is evacuated to a set pressure of between about 0.2 to 5.0 Torr and said vent line is evacuated to a pressure of about 50 Torr or less.

5. In an apparatus for alternately feeding a first gas successively through a first pressure regulator, a first feed line and a first changeover valve to a chamber evacuated to a set pressure, or feeding a second gas successively through a second pressure regulator, a second feed line and a second changeover valve to said chamber, the improvement comprising means for alternately evacuating the second feed line when the first changeover valve is open to feed the first gas to the chamber, and evacuating said first feed line when the second changeover valve is open to feed the second gas to the chamber, whereby the pressure in said first feed line at the time said first changeover valve is opened and the pressure in said second feed line at the time said second changeover valve is opened is approximately equal to the set pressure in the chamber.

6. The improvement as claimed in claim 5 wherein the means for alternately evacuating the first and second feed lines comprises a vent line, a vacuum pump connected to said vent line, a first shunt valve connected between the vent line and the first feed line and a second shunt valve connected between the vent line and the second feed line.

7. The improvement as claimed in claim 6 wherein said first and second changeover valves and said first and second shunt valves are direct touch metal diaphragm valves.

8. The improvement as claimed in claim 6 and further comprising a pressure regulating valve for regulating the pressure in said vent line, said pressure regulating valve venting said vent line to atmosphere to regulate the pressure in said vent line.

9. The improvement as claimed in claim 7 wherein said first and second pressure regulators are mass flow controllers for controlling the rate of flow of said first and second gases to said chamber so as to substantially maintain said set pressure in said chamber.

10. The improvement as claimed in claim 7 wherein said first and second pressure regulators, said first and second changeover valves and said first and second shunt valves comprise direct touch metal diaphragm valves.

11. The improvement as claimed in claim 5 wherein said chamber is a chamber in which a film is formed on a wafer, said first and second gases being a reactive gas and an inert gas, respectively, and means for evacuating said chamber to said set pressure.

* * * * *